United States Patent
Park (10) Patent No.: US 7,471,537 B1
(45) Date of Patent: Dec. 30, 2008

(54) CONTENT ADDRESSABLE MEMORIES (CAM) HAVING LOW POWER DYNAMIC MATCH LINE SENSING CIRCUITS THEREIN

(75) Inventor: Kee Park, San Jose, CA (US)

(73) Assignee: Integrated Device Technology, Ltd., San Jose, CA (US)

( * ) Notice: Subject to any disclaimer, the term of this patent is extended or adjusted under 35 U.S.C. 154(b) by 0 days.

(21) Appl. No.: 11/751,900

(22) Filed: May 22, 2007

Related U.S. Application Data (60) Provisional application No. 60/805,649, filed on Jun. 23, 2006.

(51) Int. Cl.
G11C 15/00 (2006.01)
(52) U.S. Cl. .................................. 365/49.17
(58) Field of Classification Search ............ 365/49, 365/49.17, 49.1
See application file for complete search history.

(56) References Cited

U.S. PATENT DOCUMENTS

| | | | |
|---|---|---|---|
| 5,808,929 | A | 9/1998 | Sheikholeslami et al. |
| 5,828,593 | A | 10/1998 | Schultz et al. |
| 5,859,791 | A | 1/1999 | Schultz et al. |
| 5,930,161 | A | 7/1999 | Sheikholeeslami et al. |
| 5,995,401 | A | 11/1999 | Schultz et al. |
| 6,061,262 | A | 5/2000 | Schultz et al. |
| 6,169,685 | B1 | 1/2001 | Gandini et al. |
| 6,195,277 | B1 * | 2/2001 | Sywyk et al. ............ 365/49.15 |
| 6,373,738 | B1 * | 4/2002 | Towler et al. ............ 365/49.1 |
| 6,768,659 | B2 | 7/2004 | Gillingham et al. |
| 6,987,682 | B2 | 1/2006 | Ma et al. |
| 7,126,834 | B1 | 10/2006 | Meng et al. |
| 7,251,148 | B2 | 7/2007 | Ma et al. |
| 2003/0161194 | A1 * | 8/2003 | Ma et al. ............. 365/200 |
| 2007/0242493 | A1 | 10/2007 | Kuliyampattil et al. |

FOREIGN PATENT DOCUMENTS

JP 2002245783 A * 8/2002

* cited by examiner

*Primary Examiner*—Hoai V Ho
*Assistant Examiner*—Jay Radke
(74) *Attorney, Agent, or Firm*—Myers Bigel Sibley & Sajovec (57) ABSTRACT

A content addressable memory array includes a plurality of rows of active CAM cells electrically coupled to a corresponding plurality of active match lines and at least one row of dummy cells, which are configured to generate an always-match condition on a dummy match line when the CAM array is undergoing a search operation. A match line pull-up circuit is provided. This match line pull-up circuit is electrically coupled to the plurality of active match lines and the dummy match line. The pull-up circuit is responsive to a calibration control signal that sets a pull-up strength of the match line pull-up circuit when the CAM array is undergoing the search operation. A sense amplifier, which is coupled to the match lines, includes a control circuit configured to adjust the calibration control signal in response to evaluating a first voltage on the dummy match line relative to a reference voltage.

17 Claims, 9 Drawing Sheets

CONTENT ADDRESSABLE MEMORIES (CAM) HAVING LOW POWER DYNAMIC MATCH LINE SENSING CIRCUITS THEREIN

REFERENCE TO PRIORITY APPLICATION

This application claims priority to U.S. Provisional Application Ser. No. 60/805,649, filed Jun. 23, 2006, the disclosure of which is hereby incorporated herein by reference.

FIELD OF THE INVENTION

The present invention relates to integrated circuit search engine devices and methods of operating same and, more particularly, to content addressable memory (CAM) devices and methods of operating content addressable memory devices.

BACKGROUND OF THE INVENTION

Search cycle time and search latency are two factors that influence the efficiency of content addressable memory (CAM) devices when processing consecutive search instructions. Unfortunately, many techniques to reduce search cycle time and/or search latency often lead to significant increases in power consumption, particularly when a large number of CAM array blocks within a multi-block CAM core are searched in parallel. To address this problem of excessive power consumption, techniques have been developed to convert a global search operation within a CAM core into a plurality of "segmented" search operations performed on corresponding segments of the CAM core. Unfortunately, techniques to convert a global search operation into a plurality of lower power search operations performed sequentially can result in a significant increase in search latency associated with each global search operation. Other techniques to address excessive power consumption include lowering match line power requirements during each search cycle by reducing match line voltage fluctuations during precharge and discharge intervals within each search operation.

SUMMARY OF THE INVENTION

A content addressable memory (CAM) array according to embodiments of the invention includes a low power dynamic match line sensing circuit. This match line sensing circuit is electrically coupled to active match lines associated with a plurality of rows of active CAM cells and at least one dummy match line associated with a corresponding row of dummy cells. This row of dummy cells is configured to generate an always-match condition on the dummy match line when the row of dummy match cells is undergoing a search operation. The dummy cells may be CAM cells in some embodiments of the invention.

A match line pull-up circuit is also provided. The match line pull-up circuit is electrically coupled to the plurality of active match lines and the dummy match line. The match line pull-up circuit is responsive to a calibration control signal that sets a pull-up strength of the match line pull-up circuit when the CAM array is undergoing the search operation. The low power dynamic match line sensing circuit includes a sense amplifier, which is electrically coupled to the plurality of active match lines and the dummy match line. The sense amplifier includes a control circuit, which is configured to adjust the calibration control signal in response to evaluating a first voltage on the dummy match line. This evaluation of the first voltage may be performed as a comparison of the first voltage relative to a reference voltage.

The match line pull-up circuit is also responsive to a clock signal having an active phase that sets a duration of an active pull-up time interval when the CAM array is undergoing the search operation. The control circuit is configured to adjust the calibration control signal (e.g., multi-bit signal) to a value that causes the dummy match line to be sufficiently charged to a match level voltage during the pull-up time interval.

According to additional embodiments of the invention, the sense amplifier includes a first differential amplifier having a first input terminal electrically coupled to a first one of the plurality of active match lines. A voltage generator is also provided, which is configured to generate the reference voltage at the match level. The sense amplifier also includes a second differential amplifier having a first input terminal electrically coupled to the dummy match line and a second input terminal configured to receive the reference voltage. The voltage generator may also be configured to generate a second reference voltage having a magnitude less than the first reference voltage. The first differential amplifier may have a second input terminal configured to receive the second reference voltage.

According to still further embodiments of the invention, the match line pull-up circuit is responsive to at least one control signal selected from a group consisting of a multi-bit calibration control signal and a clock signal. In the event the clock signal is used as control signal, the duty cycle of the clock signal may be varied in order to vary the pull-up strength of the match line pull-up circuit when the CAM array is undergoing the search operation.

DESCRIPTION OF PREFERRED EMBODIMENTS

The present invention will now be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals. The suffix "#" (or prefix symbol "/") to a signal name may also denote a complementary data or information signal or an active low control signal, for example.

Figure 1A:
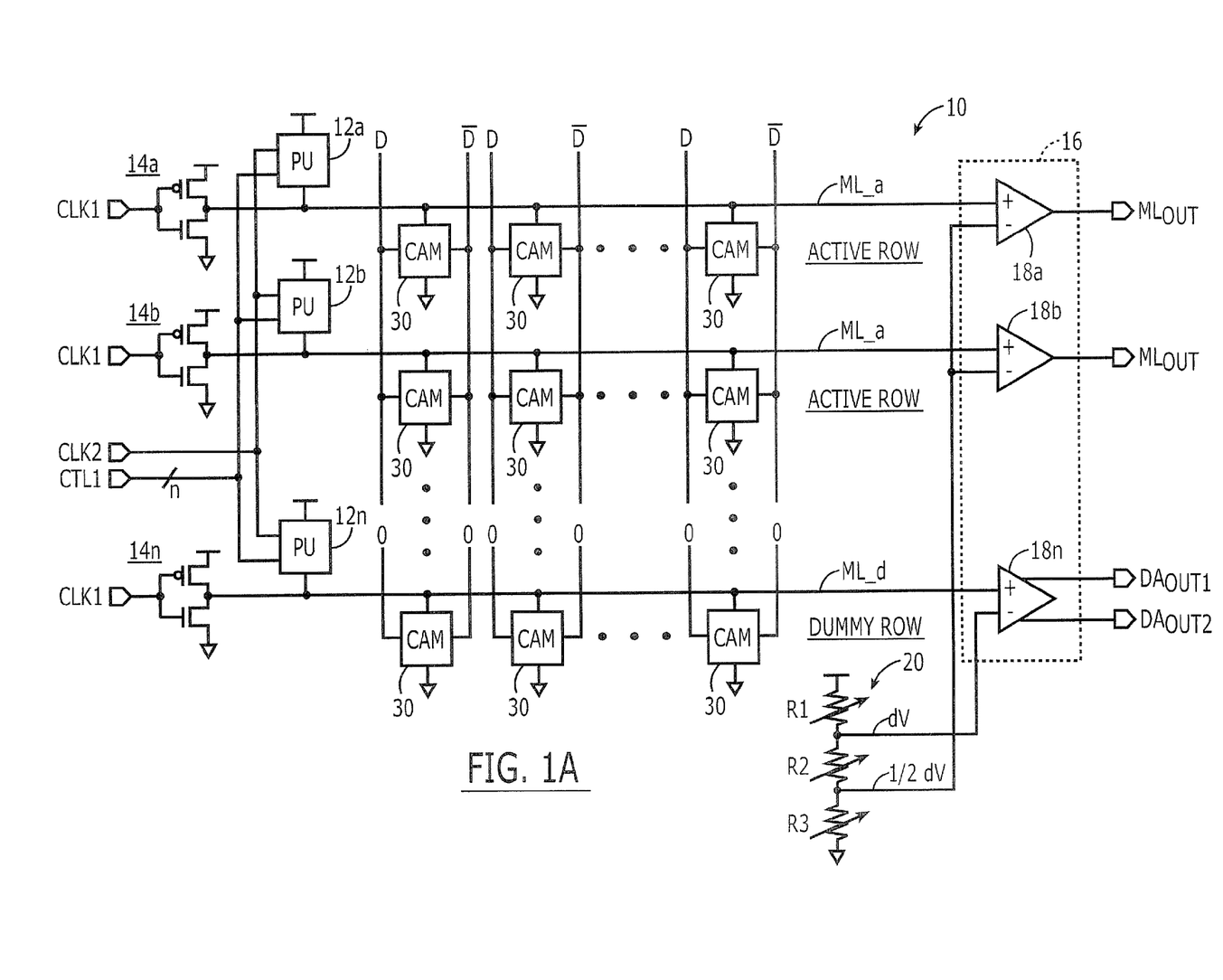
FIG. 1A is an electrical schematic of a CAM array according to embodiments of the invention.
Figure 1B:
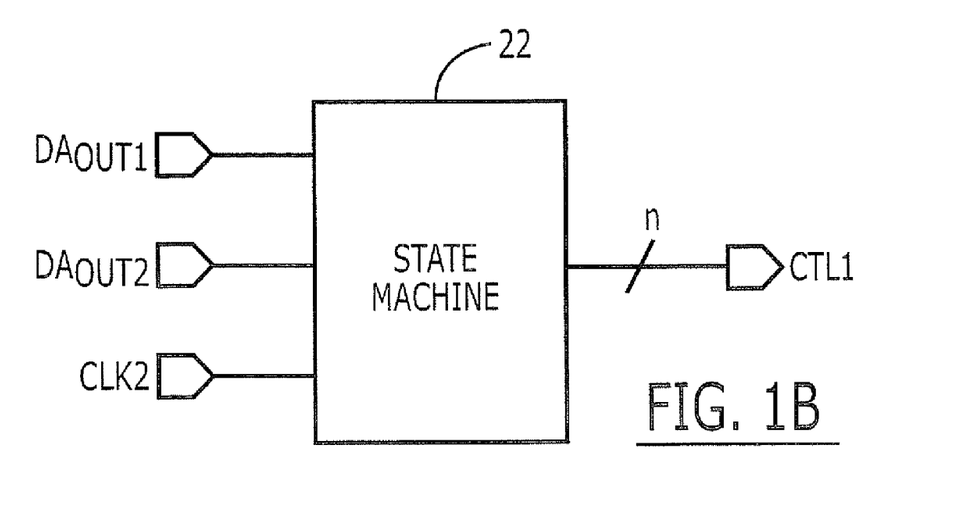
FIG. 1B is a block diagram of a state machine used in a sense amplifier control circuit, according to embodiments of the present invention.
Figure 1C:
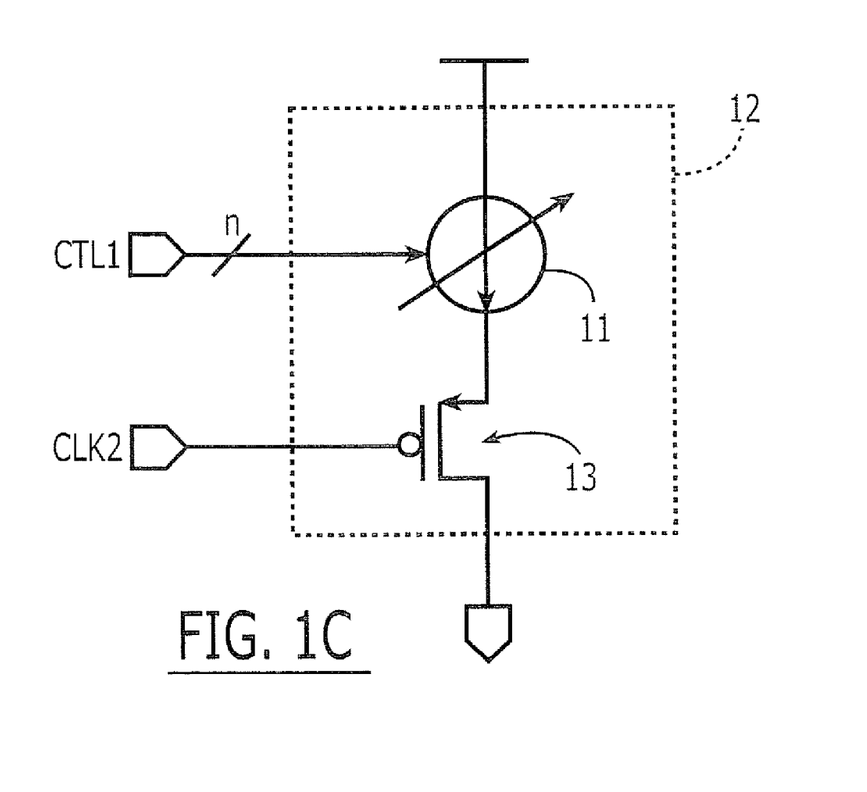
FIG. 1C is an electrical schematic of a match line pull-up circuit according to embodiments of the present invention.

FIGS. 1A-1C illustrates CAM array 10 according to embodiments of the present invention. This CAM array 10 includes a plurality of rows of active CAM cells 30 (within a search path of the CAM array) and at least one row of dummy cells (outside the search path of the CAM array). As illustrated in FIG. 1A, the dummy cells may be configured as CAM cells 30 that are fixed in a globally masked condition (where D=/D=0) so that the row of dummy cells yields a "match" result for all search operations. The CAM cells 30 associated with the active rows are electrically coupled to corresponding data lines D and /D, which receive data during read, write and search operations within the CAM array 10.

Each of the active match lines ML_a and a dummy match line ML_d are electrically coupled to corresponding drivers 14a-14n. These drivers are illustrated as CMOS inverters that are responsive to a clock signal CLK1. The PMOS pull-up transistors within these CMOS inverters may be configured to provide a relatively weak pull-up force on the respective match lines. This relatively weak pull-up force may be provided by configuring the PMOS transistors as relatively narrow and long channel length transistors.

A plurality of match line pull-up circuits $12a, 12b, \ldots, 12n$ are electrically coupled to a corresponding plurality of match lines ML_a and ML_d. These match line pull-up circuits $12a$-$12n$ are active when the CAM array 10 is undergoing a search operation. The match line pull-up circuits $12a$-$12n$ provide a relatively strong pull-up force on the match lines during each search operation. As illustrated by FIG. 1C, each match line pull-up circuit 12 includes a variable pull-up current source 11 and a PMOS pull-up transistor 13. The PMOS pull-up transistor 13 has a gate terminal that receives a clock signal CLK2, which is active at a low level during an early portion of each search operation. The strengths of the pull-up current sources 11 are set by a multi-bit calibration control signal CTL1. As will be understood by those skilled in the art, the "strength" of a pull-up current source 11 is a function of the magnitude of the pull-up current provided by the current source 11 to a corresponding match line when the corresponding PMOS pull-up transistor 13 is turned on (i.e., CLK2=0). In particular, the strength of the match line pull-up circuit 12 is a function of the total charge (coulombs) generated by the match line pull-up circuit 12 during an active cycle (e.g., when CLK2=0). In this case, the total charge is a product of the pull-up current (coulombs/sec) provided to a match line and the duration of the interval during which the pull-up current is provided by the pull-up circuit 12.

The CAM array 10 includes a sense amplifier 16, which is electrically connected to the active and dummy match lines ML_a and ML_d. This sense amplifier 16 is illustrated as including a plurality of differential amplifiers $18a$-$18n$. A plurality of the differential amplifiers $18a$, $18b$, have first input terminals (shown as +) connected to corresponding active match lines ML_a and the differential amplifier $18n$ has a first input terminal connected to the dummy match line ML_d. The differential amplifiers $18a$, $18b$, . . . generate match line output signals MLout. The differential amplifier $18n$ generates a pair of differential output signals DAOUT1 and DAOUT2.

A voltage generator 20 is provided to generate a plurality of reference voltages: dV and ½ dV. As illustrated, the voltage generator 20 may be configured as a voltage divider. This voltage divider may be configured as a totem pole arrangement of variable resistors R1, R2 and R3. The resistance established by these variable resistors may be set by fuses and/or programmable registers (not shown).

The sense amplifier 16 also includes a control circuit which is configured to adjust the calibration control signal CTL1 in response to evaluating a voltage on the dummy match line ML_d relative to the reference voltage dV. This control circuit includes the differential amplifier $18n$ and the state machine 22 illustrated by FIG. 1B. This state machine 22 is also responsive to the second clock signal CLK2. During a built-in test operation and/or calibration operation, the state machine 22 evaluates the differential output signals DAOUT1 and DAOUT2 and adjusts the value of the calibration control signal CTL1 (up or down) to thereby vary the pull-up strengths of the current sources 11. This adjustment continues until the voltage on the dummy match line ML_d achieves a level equivalent to the reference voltage dV during an active time interval having a duration set by the second clock signal CLK2.

Figure 2:
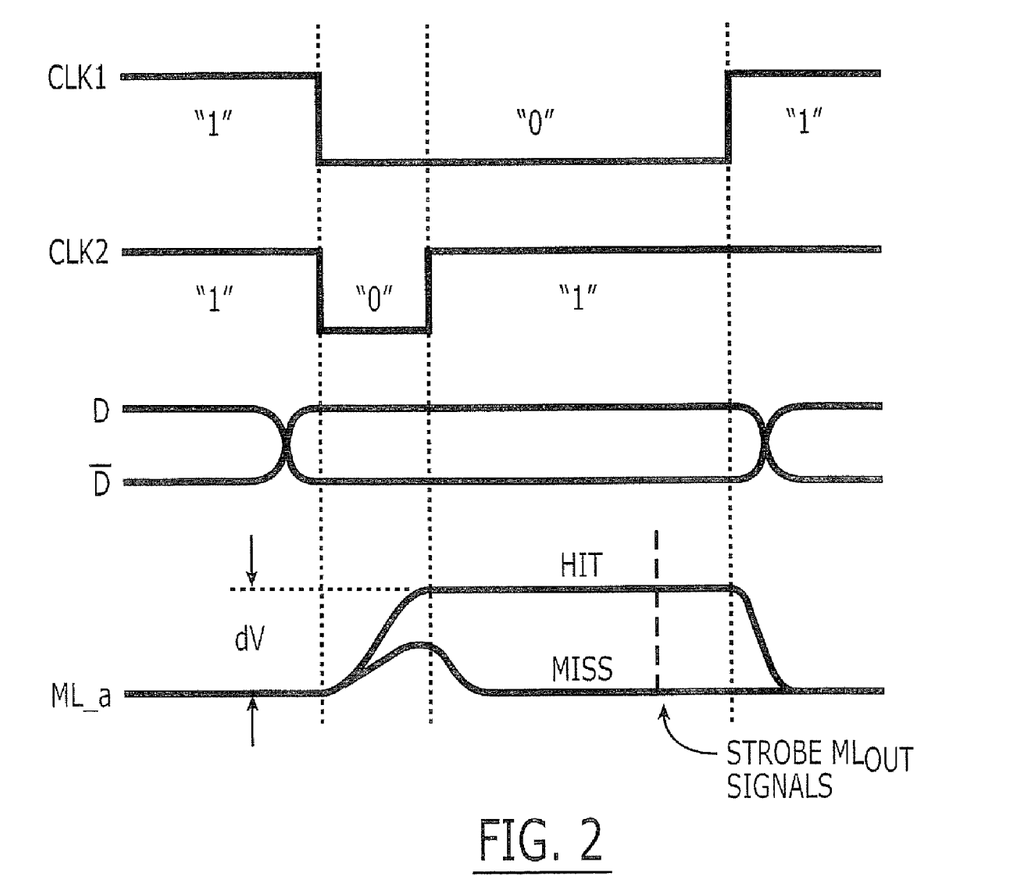
FIG. 2 is a timing diagram that illustrates operation of the circuits of FIGS. 1A-1C.

The active time interval of the second clock signal CLK2 is illustrated by the timing diagram of FIG. 2. In FIG. 2, the clock signals CLK1 and CLK2 are both switched high-to-low (i.e., to active low levels) upon commencement of a search operation when the data lines D and /D are driven with corresponding bits of a search key. In response to this high-to-low switching, the drivers $14a$-$14n$ provide a relatively weak pull-up force on the match lines ML_a-ML_d and the match line pull-up circuits $12a$-$12n$ provide a relatively strong pull-up force on the match lines. This strong pull-up force causes all match lines associated with CAM entries (i.e., CAM rows) representing a match condition to be pulled high by an amount about equivalent to the reference voltage dV (previously set during calibration/self-test). This complete pull-up of the match lines associated with matching entries occurs at the point of termination of the active time interval associated with the second clock signal CLK2 (i.e., at the point where CLK2 switches low-to-high). Termination of the active time interval associated with the second clock signal CLK2 also causes all match lines associated with CAM entries representing a miss condition to be pulled back to a logic 0 level by virtue of the fact that the pull-down strength of any CAM cell representing a miss condition is greater than the pull-up force provided by the PMOS transistor within a driver $14a$-$14n$. Subsequent to termination of the active time interval associated with the second clock signal CLK2, the outputs (MLout) of the differential amplifiers $18a$, $18b$, are strobed to determine the states (miss or match) of the active match lines ML_a and thereby determine the presence of any matching entries within the CAM array 10.

Figure 3:
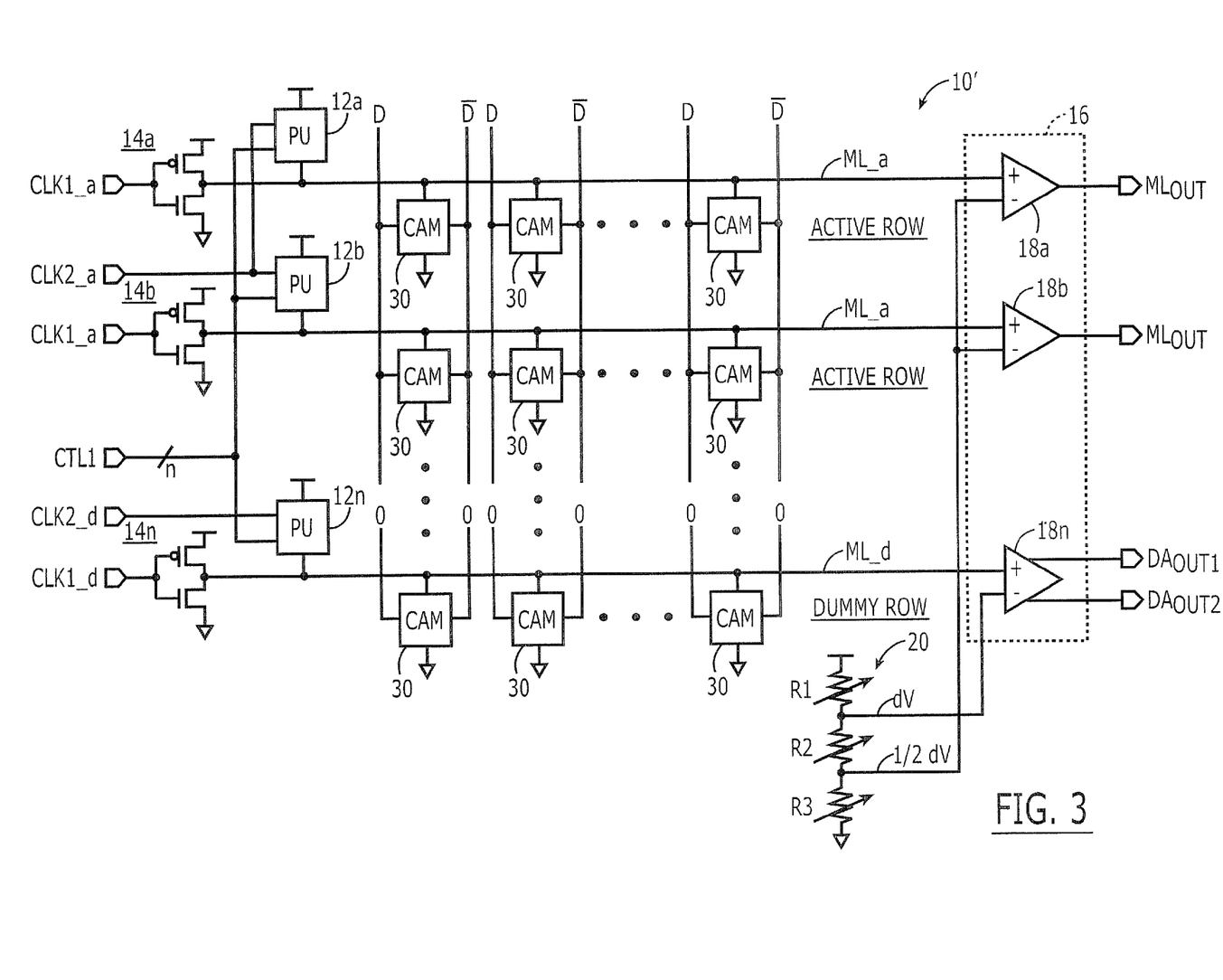
FIG. 3 is an electrical schematic of a CAM array according to another embodiment of the invention.

FIG. 3 illustrates a CAM array 10' according to an additional embodiment of the present invention. This CAM array 10' is similar to the CAM array 10 of FIG. 1A, however, the clock signals CLK1 and CLK2 are converted into "a" clock signals CLK1_a and CLK2_a associated with the active match lines ML_a and "d" clock signals CLK1_d and CLK2_d associated with the dummy match line ML_d. The use of different clock signals for the active and dummy match lines accommodates different search timing for the active and dummy rows of CAM cells 30.

Figure 4A:
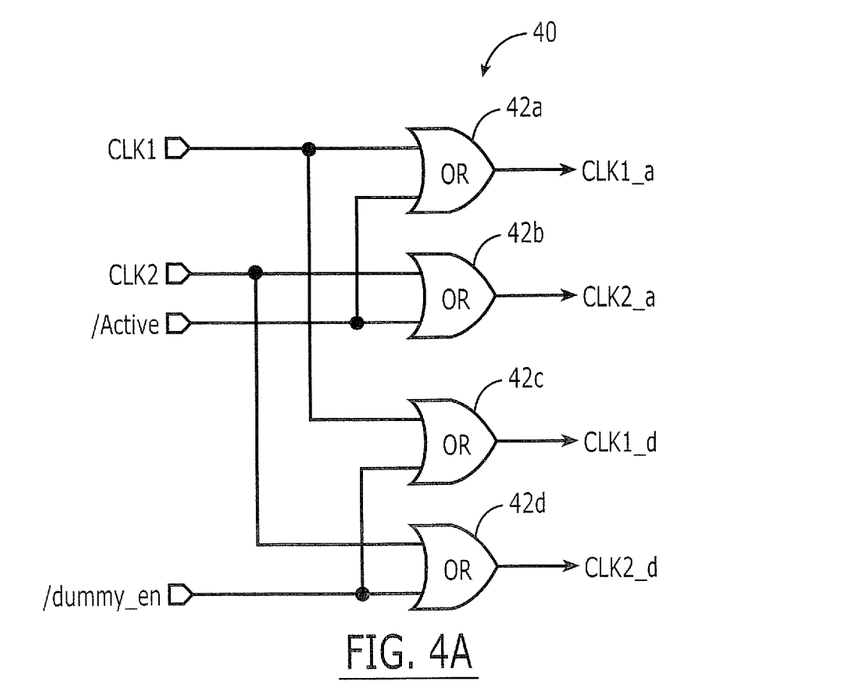
FIG. 4A is an electrical schematic of a clock generator according to embodiments of the invention.
Figure 4B:
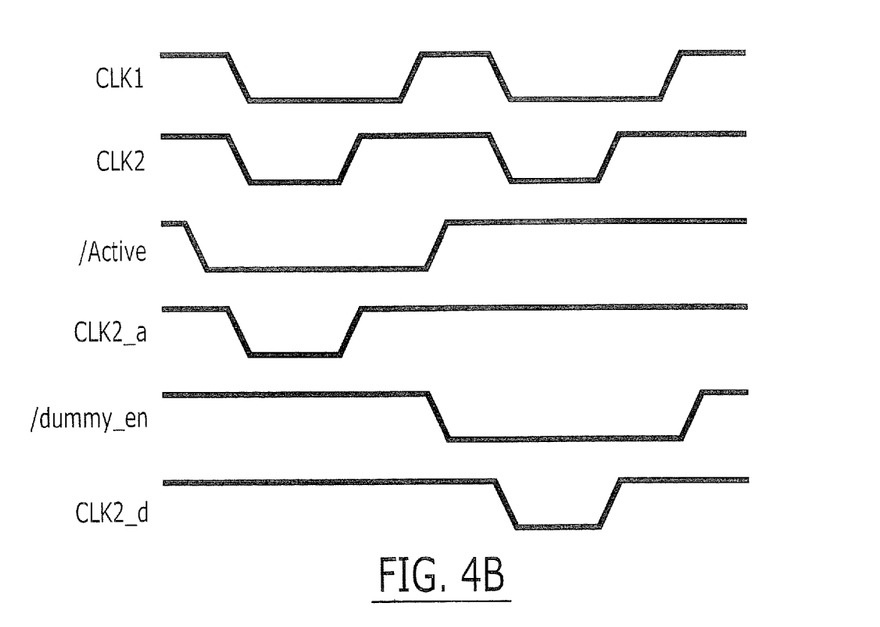
FIG. 4B is a timing diagram that illustrates operation of the clock generator of FIG. 4A.

FIG. 4A illustrates a clock generator 40 having a plurality of OR gates 42a-42d therein. This clock generator 40 is configured to generate the clock signals CLK1_a, CLK1_d, CLK2_a, CLK2_d, in response to the clock signals CLK1 and CLK2 and a pair of active-low enable signals: /Active and /dummy_en. As illustrated by the timing diagram of FIG. 4B, the active low periods of the clock signals CLK1 and CLK2 can be can be selected by the OR gates 42a-42d in order to generate the clock signals CLK1_a and CLK1_d from the clock signal CLK1 and the clock signals CLK2_a and CLK2_d from the clock signal CLK2. This selection is achieved by setting the active-low enable signals /Active and /dummy_en to low levels during non-overlapping time intervals, as illustrated by the timing diagram of FIG. 4B. Based on this timing, separate control of the active match lines ML_a and dummy match line ML_d can occur independently.

Figure 5:
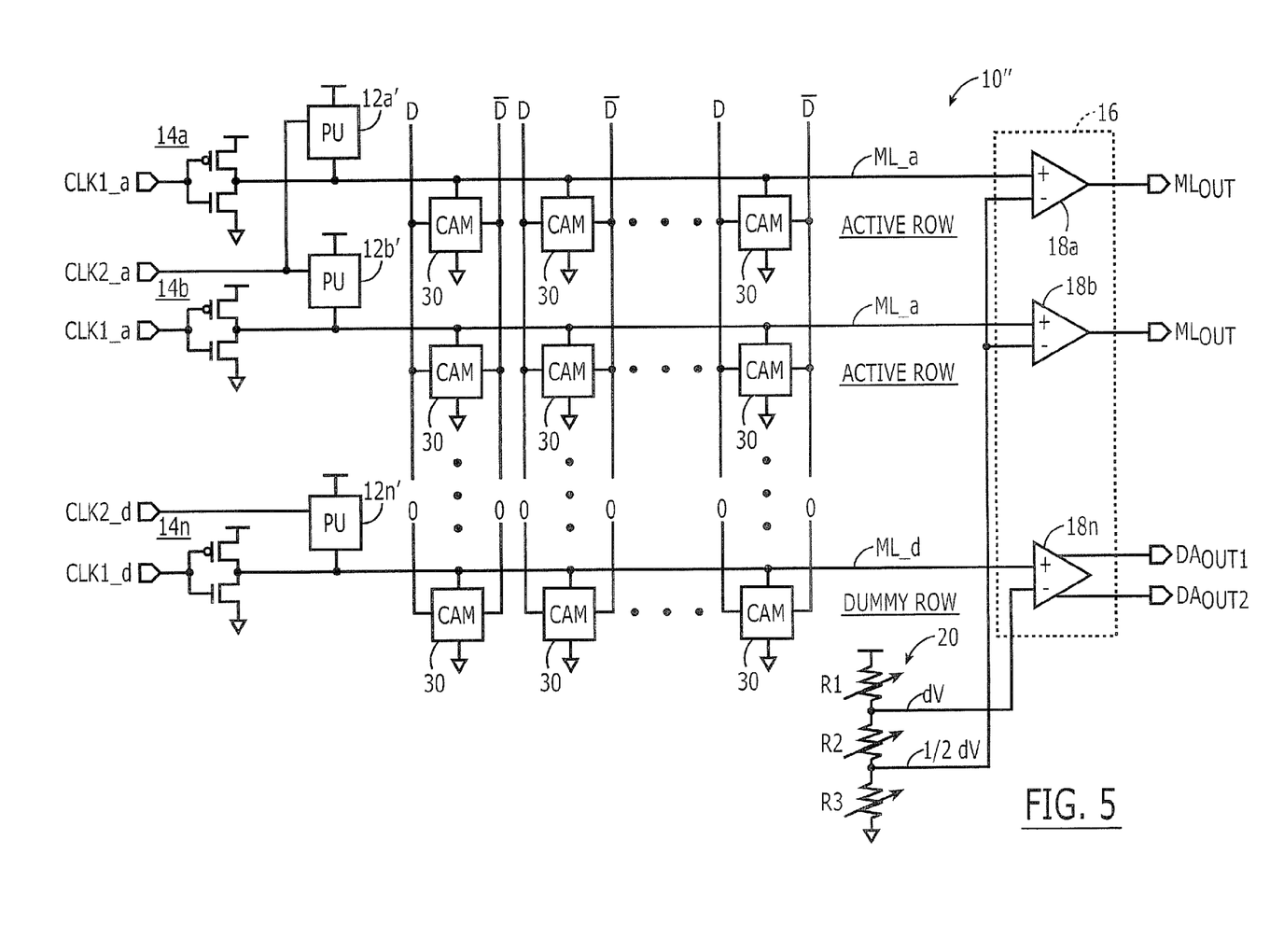
FIG. 5 is an electrical schematic of a CAM array according to an embodiment of the invention.
Figure 6A:
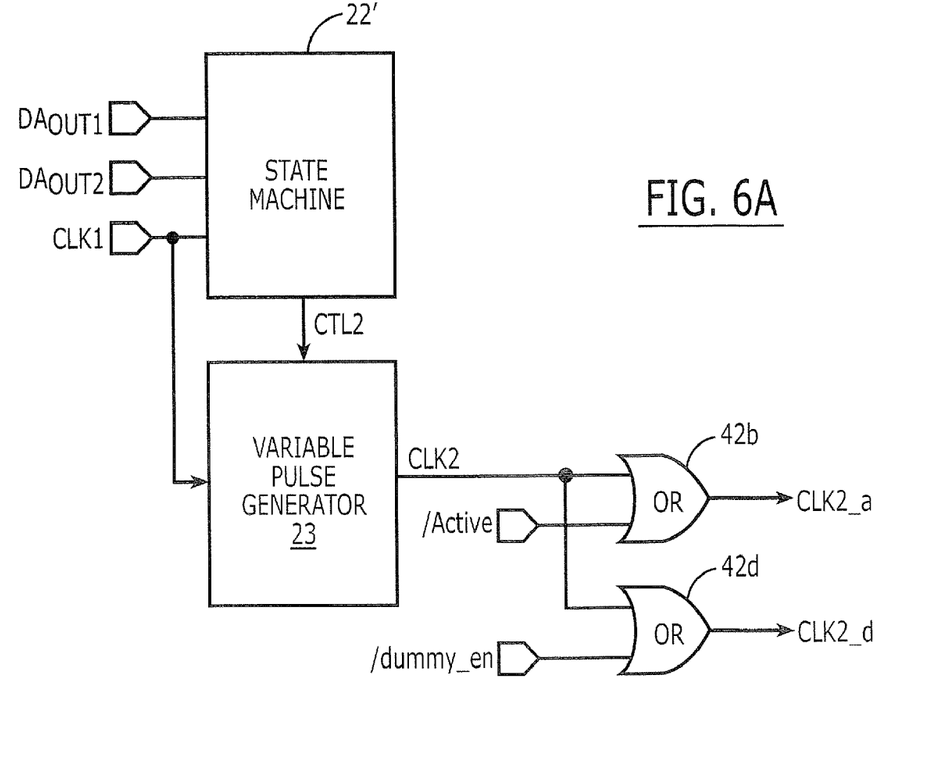
FIG. 6A is a block diagram of a state machine and clock generator used in a sense amplifier control circuit, according to embodiments of the present invention.

FIG. 5 illustrates a CAM array 10" that is similar to the CAM array 10' of FIG. 3, however, each of the match line pull-up circuits 12a', 12b', 12n' is responsive to a corresponding clock signal (CLK2_a or CLK2_d), but is not responsive to the control signal CTL1 shown in FIGS. 1 and 3. FIG. 6A is a block diagram of a state machine 22' and clock generator that may be used in a sense amplifier control circuit to generate the clock signals CLK2_a and CLK2_d. These clock signals are received by the match line pull-up circuits 12a', 12b', ..., 12n' used in the CAM array 10" of FIG. 5. The clock generator is illustrated as including a variable pulse generator 23 and a pair of OR gates 42b and 42d for generating the clock signals CLK2_a and CLK2_d. Additional OR gates 42a and 42c (see, e.g., FIG. 4A) are also used to generate the clock signals CLK1_a and CLK1_d.

Figure 6B:
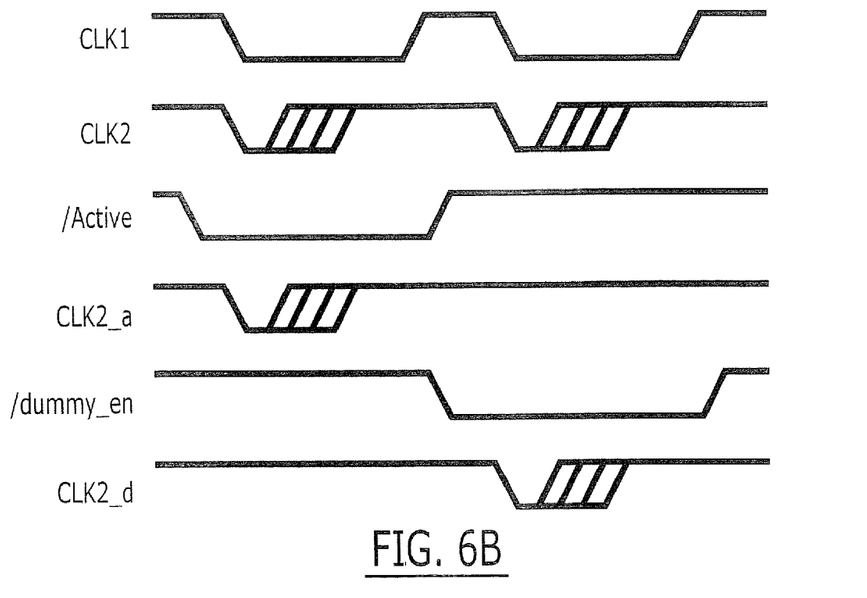
FIG. 6B is a timing diagram that illustrates operation of the clock generator of FIG. 6A.
Figure 6C:
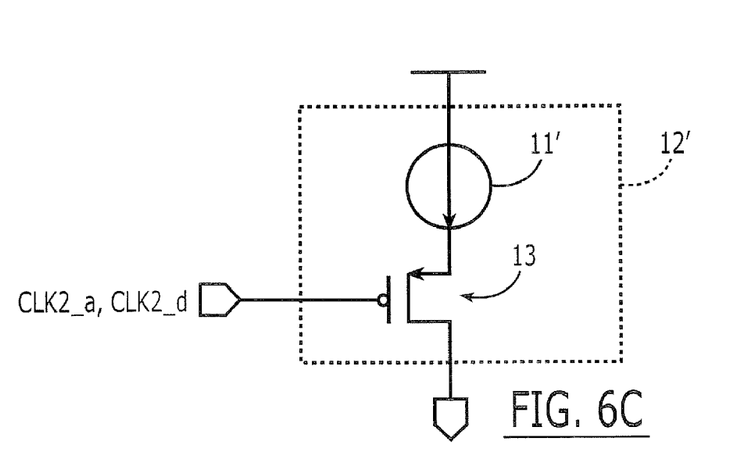
FIG. 6C is an electrical schematic of a match line pull-up circuit that may be used the CAM array of FIG. 5.

In contrast to the state machine 22 of FIG. 1B, the state machine 22' of FIG. 6A generates a control signal CTL2 having a value that is used by the variable pulse generator 23 to set the active pulse width of the clock signal CLK2, which is generated from the clock signal CLK1. As illustrated by the timing diagram of FIG. 6B, the clock signal CLK2 is provided to the OR gates 42b and 42d, which independently generate the clock signals CLK2_a (for the active match lines) and CLK2_d (for the dummy match line). As illustrated by FIG. 6C, these clock signals CLK2_a and CLK2_d are provided to corresponding match line pull-up circuits 12'. In particular, the variable width of the active-low portions of the clock signals CLK2_a and CLK2_d, which is a function of the value of the control signal CTL2, operates to set the pull-up strength of the match line pull-up circuits 12'. In this case, the pull-up strength of the match line pull-up circuit 12' is a function of the total charge (Q) provided to the corresponding match line (ML_a or ML_d) while the clock signal CLK2_a or CLK2_d is active at a low voltage. As will be understood by those skilled in the art, this total charge Q is a product of the pull-up current through the PMOS transistor 13, which is set by the pull-up current source 11', and the time duration of the active low portion of the clock signal CLK2_a (or CLK2_d).

Figure 7A:
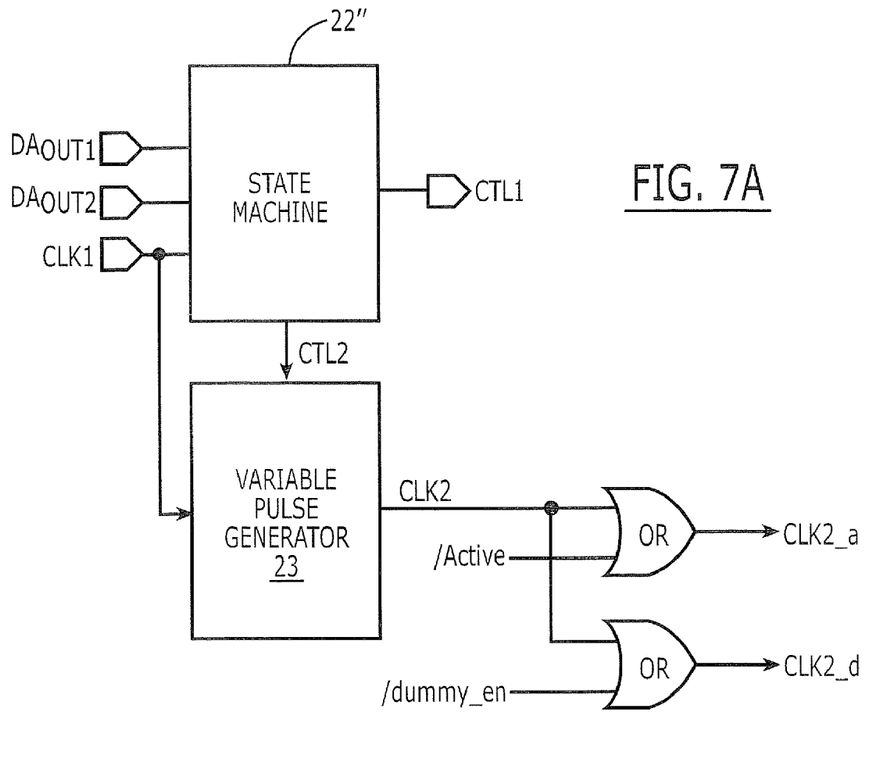
FIG. 7A is a block diagram of a state machine and clock generator used in a sense amplifier control circuit, according to additional embodiments of the present invention.
Figure 7B:
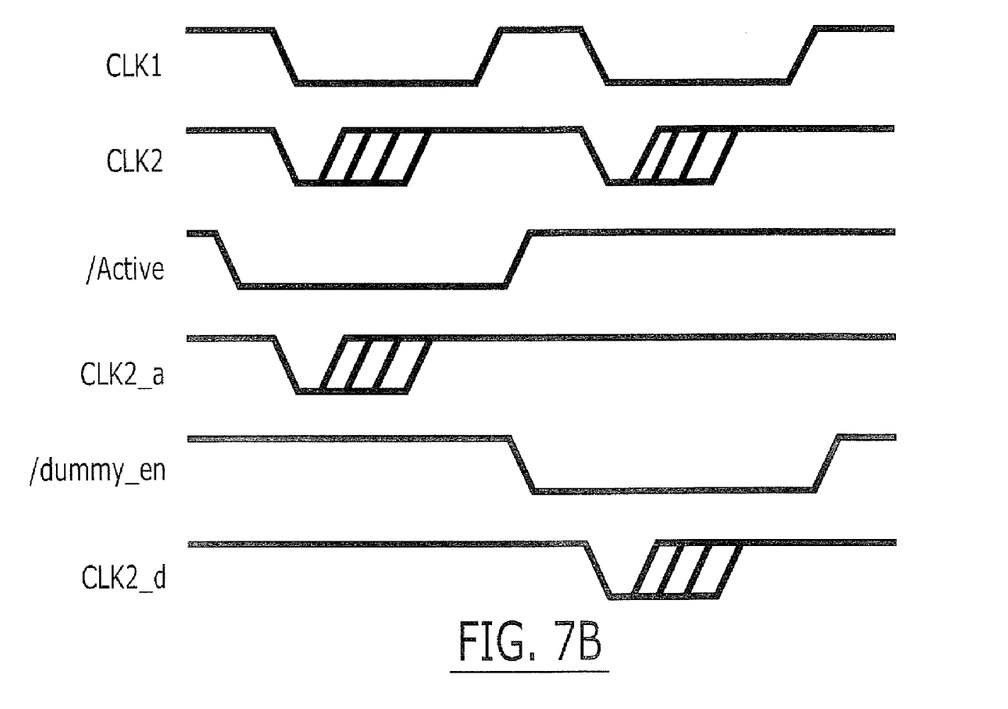
FIG. 7B is a timing diagram that illustrates operation of the clock generator of FIG. 7A.

FIG. 7A is a block diagram of another state machine 22" and clock generator that may be used in a sense amplifier control circuit and the CAM array 10' of FIG. 3. This state machine 22" generates two control signals CTL1 and CTL2. As with the state machine 22 of FIG. 1B, the control signal CTL1 is provided to the variable pull-up current source 11, as illustrated by FIG. 1C. In addition, the control signal CTL2 is provided to the variable pulse generator 23, which sets the active pulse width of the clock signal CLK2. These two control signals provide two degrees of control over the pull-up strengths of the match line pull-up circuits 12a-12n. For example, as illustrated by the timing diagram of FIG. 7B, the variable width clock signal CLK2 is provided to the OR gates 42b and 42d, which independently generate the clock signals CLK2_a (for the active match lines) and CLK2_d (for the dummy match line). Based on this configuration of the state machine 22", the pull-up circuits 12a-12n in FIG. 3, which are illustrated in detail by FIG. 1C, operate in response to two signals that control their pull-up strength: CTL1 and CLK2_a (or CLK2_d). The control signal CTL1 sets the magnitude of the current provided by the current source 11 and the duty cycle of the clock signal CLK2_a (or CLK2_d) sets the duration during which this current is provided to the corresponding match line.

In the drawings and specification, there have been disclosed typical preferred embodiments of the invention and, although specific terms are employed, they are used in a generic and descriptive sense only and not for purposes of limitation, the scope of the invention being set forth in the following claims.

The invention claimed is:

1. A content addressable memory (CAM) array, comprising:
   a plurality of rows of active CAM cells electrically coupled to a corresponding plurality of active match lines;
   a row of dummy cells configured to generate an always-match condition on a dummy match line when said row of dummy cells is undergoing a search operation;
   a match line pull-up circuit electrically coupled to the plurality of active match lines and the dummy match line and responsive to a first control signal that sets a pull-up strength of said match line pull-up circuit when the CAM array is undergoing the search operation, said match line pull-up circuit responsive to a clock signal having an active phase that sets a duration of a pull-up time interval when the CAM array is undergoing the search operation; and
   a sense amplifier electrically coupled to the plurality of active match lines and the dummy match line, said sense amplifier comprising a control circuit configured to adjust the first control signal to a value that causes the dummy match line to be sufficiently charged to a match level voltage during the pull-up time interval, in response to evaluating a first voltage on the dummy match line relative to a reference voltage.

2. The CAM array of claim 1, wherein said sense amplifier comprises a first differential amplifier having a first input terminal electrically coupled to a first one of the plurality of active match lines.

3. The CAM array of claim 1, wherein the first control signal is selected from a group consisting of a calibration control signal and a clock signal.

4. The CAM array of claim 1, further comprising a voltage generator configured to generate the reference voltage at the match level;
   and wherein said sense amplifier comprises a second differential amplifier having a first input terminal electrically coupled to the dummy match line and a second input terminal configured to receive the reference voltage.

5. The CAM array of claim 2, further comprising a voltage generator configured to generate the reference voltage at the match level; and wherein said sense amplifier comprises a second differential amplifier having a first input terminal electrically coupled to the dummy match line and a second input terminal configured to receive the reference voltage.

6. The CAM array of claim 5, wherein the voltage generator is configured to generate a second reference voltage having a magnitude less than the first reference voltage; and wherein the first differential amplifier has a second input terminal configured to receive the second reference voltage.

7. A content addressable memory (CAM) array, comprising:
- a plurality of rows of active CAM cells electrically coupled to a corresponding plurality of active match lines;
- a row of dummy cells configured to generate an always-match condition on a dummy match line when said row of dummy cells is undergoing a search operation;
- a match line pull-up circuit electrically coupled to the plurality of active match lines and the dummy match line and responsive to a first control signal that sets a pull-up strength of said match line pull-up circuit when the CAM array is undergoing the search operation, said match line pull-up circuit responsive to a clock signal having an active phase that sets a duration of a pull-up time interval when the CAM array is undergoing the search operation; and
- a sense amplifier electrically coupled to the plurality of active match lines and the dummy match line, said sense amplifier comprising a control circuit configured to adjust the first control signal to a value that causes the dummy match line to be sufficiently charged to a match level voltage during the pull-up time interval, in response to evaluating a first voltage on the dummy match line during a calibration operation.

8. The CAM array of claim 7, wherein the first control signal is a clock signal.

9. The CAM array of claim 7, wherein the first control signal is a clock signal having a duty cycle that sets the pull-up strength of said match line pull-up circuit.

10. A content addressable memory (CAM) array, comprising:
- a plurality of rows of active CAM cells electrically coupled to a corresponding plurality of active match lines;
- a row of dummy CAM cells electrically coupled to a dummy match line;
- a match line pull-up circuit electrically coupled to the plurality of active match lines and the dummy match line and responsive to a first control signal that sets a pull-up strength of said match line pull-up circuit when charging the plurality of active match lines and the dummy match line, said match line pull-up circuit responsive to a clock signal having an active phase that sets a duration of a pull-up time interval when the CAM array is undergoing a search operation; and
- a sense amplifier electrically coupled to the plurality of active match lines and the dummy match line, said sense amplifier comprising a control circuit configured to adjust the first control signal to a value that causes the dummy match line to be sufficiently charged to a match level voltage during the pull-up time interval, in response to comparing a voltage on the dummy match line against a reference voltage.

11. The CAM array of claim 10, wherein the first control signal is a clock signal having a duty cycle that sets the pull-up strength of said match line pull-up circuit.

12. A content addressable memory (CAM) array, comprising:
- a plurality of rows of active CAM cells electrically coupled to a corresponding plurality of active match lines;
- a row of dummy cells configured to generate an always-match condition on a dummy match line when said row of dummy cells is undergoing a search operation;
- a match line pull-up circuit electrically coupled to the plurality of active match lines and the dummy match line and responsive to a first control signal that sets a pull-up strength of said match line pull-up circuit when the CAM array is undergoing the search operation; and
- a sense amplifier electrically coupled to the plurality of active match lines and the dummy match line, said sense amplifier comprising a control circuit configured to adjust the first control signal in response to evaluating a first voltage on the dummy match line relative to a reference voltage;
- wherein the first control signal is a multi-bit calibration control signal; and
- wherein said match line pull-up circuit comprises a plurality of variable pull-up current sources having magnitudes set by the first control signal.

13. A content addressable memory (CAM) array, comprising:
- a plurality of rows of active CAM cells electrically coupled to a corresponding plurality of active match lines;
- a row of dummy cells configured to generate an always-match condition on a dummy match line when said row of dummy cells is undergoing a search operation;
- a match line pull-up circuit electrically coupled to the plurality of active match lines and the dummy match line and responsive to a first control signal that sets a pull-up strength of said match line pull-up circuit when the CAM array is undergoing the search operation; and
- a sense amplifier electrically coupled to the plurality of active match lines and the dummy match line, said sense amplifier comprising a control circuit configured to adjust the first control signal in response to evaluating a first voltage on the dummy match line during a calibration operation;
- wherein the first control signal is a multi-bit calibration control signal; and
- wherein said match line pull-up circuit comprises a plurality of variable pull-up current sources having magnitudes set by the first control signal.

14. A content addressable memory (CAM) array comprising:
- a plurality of rows of active CAM cells electrically coupled to a corresponding plurality of active match lines;
- a row of dummy CAM cells electrically coupled to a dummy match line;
- a match line pull-up circuit electrically coupled to the plurality of active match lines and the dummy match line and responsive to a first control signal that sets a pull-up strength of said match line pull-up circuit; and
- a sense amplifier electrically coupled to the plurality of active match lines and the dummy match line, said sense amplifier comprising a control circuit configured to adjust the first control signal in response to comparing a voltage on the dummy match line against a reference voltage;
- wherein the first control signal is a multi-bit calibration control signal; and
- wherein said match line pull-up circuit comprises a plurality of variable pull-up current sources having magnitudes set by the first control signal.

15. The CAM array of claim 1, wherein the first control signal sets a magnitude of a pull-up current provided by said match line pull-up circuit to the plurality of active match lines when the CAM array is undergoing the search operation.

16. The CAM array of claim 7, wherein the first control signal sets a magnitude of a pull-up current provided by said match line pull-up circuit to the plurality of active match lines when the CAM array is undergoing the search operation.

17. The CAM array of claim 10, wherein the first control signal sets a magnitude of a pull-up current provided by said match line pull-up circuit to the plurality of active match lines when the CAM array is undergoing the search operation.

* * * * *